United States Patent [19]

Stuebing

[11] Patent Number: 4,843,255

[45] Date of Patent: Jun. 27, 1989

[54] SELF-LATCHING MONOSTABLE CIRCUIT

[75] Inventor: Carlton Stuebing, Tigard, Oreg.

[73] Assignee: Tektronix, Inc., Beaverton, Oreg.

[21] Appl. No.: 154,814

[22] Filed: Feb. 10, 1988

[51] Int. Cl.$^4$ .................. H03K 3/284; H03K 5/04; H03K 5/12; H03K 4/10

[52] U.S. Cl. .................................... 307/273; 307/263; 307/365; 307/269; 328/58; 328/181; 328/185

[58] Field of Search ............... 307/273, 269, 265, 263, 307/228; 328/58, 207, 181, 183, 184, 185, 59

[56] References Cited

U.S. PATENT DOCUMENTS

| | | | |
|---|---|---|---|
| 3,192,408 | 6/1965 | Cho | 307/265 |
| 3,210,558 | 10/1965 | Owen | 307/228 |
| 3,346,743 | 10/1967 | Stenglein | 328/58 |
| 3,353,034 | 11/1967 | Betz et al. | 328/58 |
| 3,484,624 | 12/1969 | Rasiel et al. | 307/265 |
| 3,588,543 | 6/1971 | Schwartz | 307/265 |
| 3,892,083 | 6/1979 | Norris | 328/58 |
| 4,293,781 | 10/1981 | Yamada et al. | 307/273 |
| 4,509,494 | 4/1985 | Nishitoba et al. | 307/265 |
| 4,667,118 | 5/1987 | Maruta | 307/265 |

OTHER PUBLICATIONS

"Fast Monostable Multivibrators Using E.C.L. Gages", Electron (GB) No. 9, Jul. 27, 1972.
"A Few IC Gates Add to a Monostable", Electronic Design 14, Jul. 4, 1968.
The TTL Data Book, Texas Instruments, 1967, pp. 6-64 to 6-67.
Casasent, Ed., Digital Electronics, "Monostables and Astables", pp. 193-209, 1974.
"Industrial Blocks: LM555/LM555C Timer", National Semiconductor Linear Data Book, 1982, pp. 9-33 to 9-38.
"ECL One Shot-MC10198", Drawing 3NG AF4, Motorola, Inc., 1975.
Horowitz and Hill, *The Art of Electronics*, Cambridge University Press, 1980, pp. 351-357.

Primary Examiner—Stanley D. Miller
Assistant Examiner—Trong Quang Phan
Attorney, Agent, or Firm—Edward B. Anderson; Peter J. Meza

[57] ABSTRACT

A monostable circuit responsive conditionally to a circuit input signal for generating a circuit output signal having a pulse of a predetermined duration includes an AND gate having two input ports and an output port. ONe of the input ports is coupled to the circuit input signal and inverts that signal. The other of the input ports is coupled to the circuit output signal. A reset OR gate receives a reset signal and the output of the AND gate. When the reset signal is low, the reset OR gate outputs the output of the AND gate, thus enabling the curcuit. The output of the reset OR gate also goes to a ramp generator having a ramp capacitor, the charging current to which is provided by a current driver. The reference voltage for a comparator is provided by circuitry identical to that associated with the ramp capacitor except that an intermediate bias reference is applied to it. This bias reference is compensated for the effect temperature changes on the circuit. An external current source operating through a current mirror drives the capacitor current driver and the reference voltage. The outputs of the comparator and the reset OR gate are input into the output OR gate for producing the circuit output signal. When the output signal is low, or logic true, the AND gate is latched so that changes in the circuit input signal during this time period do not affect circuit operation.

8 Claims, 8 Drawing Sheets

SELF-LATCHING MONOSTABLE CIRCUIT

BACKGROUND OF THE INVENTION

This invention relates to monostable circuits, and more particularly, to such circuits which are self-latching and have a pulse width which is controllable.

A monostable circuit is a fairly general purpose circuit used in various electronic environments. It is commonly used as a timing circuit and is available in a lower performance version referred to as a 555 timer circuit. That circuit is a TTL based circuit which also comes in a CMOS version and is used for timing or simply turning on other circuits. Those circuits require the addition of a resistor and capacitor to define the circuit timing. The shortest pulse which can typically be produced is approximately one microsecond.

The preferred embodiment of the present invention is intended for use specifically in an oscilloscope for such functions as glitch triggering, glitch filtering, slew rate detection and metatransition triggering. It is intended to be used to discriminate pulses to determine whether an input signal has a pulse width greater than or less than a predetermined amount. However, unlike conventional monostable circuits, it was necessary to develop one which would be functional at the level of up to 500 MHz sample rate in the 400 to 500 picosecond pulse width range.

Such a circuit could also be used for other things, such as setting up the pulse width on an external clock or to provide probe timing skewing where the clocks in a digital oscilloscope would be delayed in order to compensate for differences in probe length. It will be understood that there are also other applications for such a circuit.

These functions may also be provided by the use of a substantial number of flip flops to count timing or the use of very involved circuitry having a very large number of transistors.

SUMMARY OF THE INVENTION

The present invention provides a high speed, high performance circuit that is relatively simple in its construction, uses relatively few transistors, and therefore is relatively inexpensive to make in that it does not require much integrated circuit layout area.

In its general form, this is provided by a circuit which, once a triggering input signal change initiates the output pulse of a predetermined length, ignores any further change in the input signal during the pulse duration by latching of the input by the output signal. More particularly, the present invention provides a self-latching monostable circuit responsive conditionally to an input signal for generating an output signal having a pulse of a predetermined duration. It comprises in part AND gate means having two input ports and an output port. One of the input ports is coupled to the input signal and the other of the input ports is coupled to the output signal. It also comprises OR gate means having two input ports for generating the output signal. One of the OR gate means input ports is coupled to the AND gate means output. This circuit also comprises timing means having an input port coupled to the output port of the AND gate, and an output port coupled to the other of the input ports of the OR gate means. This timing means is responsive to the output of the AND gate means for changing the signal at the output port of the timing means from a first logic state to a second logic state a predetermined time after the output of the AND gate means changes from a first logic state to a second logic state. Thus, the output signal has a pulse of a predetermined width beginning when the input signal changes from a first to a second logic state while preventing further changes in the input signal from affecting the output signal until after passage of the predetermined period of time.

In the preferred embodiment of the present invention, an asynchronous state machine is provided using ECL logic circuitry. The input AND gate is coupled to a reset circuit functioning as a logic OR gate so that the circuit can be held in an inoperative condition by an external control until it is desired to sample the input signal. Further, one of the inputs to the input AND gate is inverted so that the circuit is latched in a nonfunctioning state so long as the input and output signals are the same logic state. More particularly, the circuit is only responsive to the input signal when a single combination of input and output states exist.

Once the selected type of input signal change occurs, a timing ramp generator is activated. Ramp timing is provided by charging a timing capacitor. The charging of the capacitor is regulated by a current source which is externally controllable over a wide range of currents, to thereby produce a wide range of timing ramps, and thereby, output pulse widths. A comparator compares the level of the voltage on the ramp capacitor to generate an output signal indicative of how that voltage level compares to a reference level. The reference level is compensated for temperature variations in the comparator so that a standard reference is maintained. Further, complementary current drivers are used in association with the ramp capacitor and reference circuitry so that improved operating linearity and noise immunity are obtained.

The OR gate generating the output signal is responsive to the output of the comparator and the output of the input AND gate to generate the output signal.

It can be seen that a monostable circuit made according to the invention is self-latching, externally controllable by a reset signal, externally controllable to provide operation over a wide range of frequencies and pulse widths, and requires relatively few components.

These and other features and advantages of the present invention will be more clearly understood from a review of the drawings and the following detailed description of the preferred embodiment.

DETAILED DESCRIPTION OF THE PREFERRED EMBODIMENT

Figure 1:
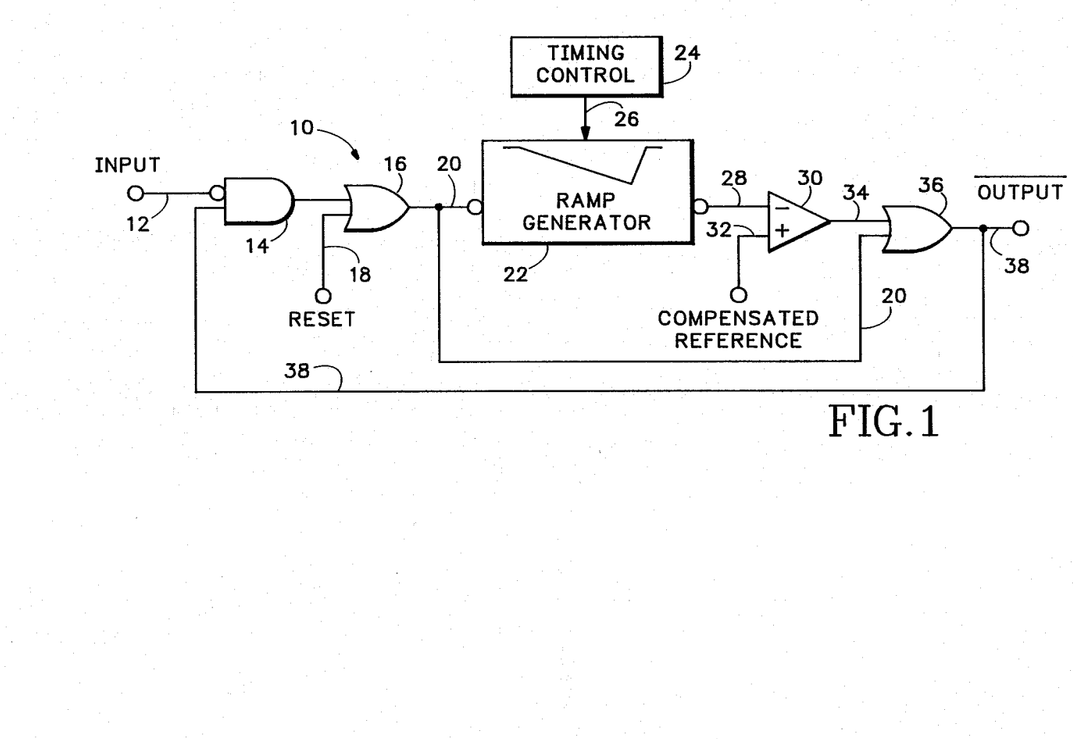
FIG. 1 is a block diagram of the preferred embodiment of a monostable circuit made according to the present invention.

Referring initially to FIG. 1, a monostable circuit made according to the invention is shown generally at 10. An input signal on a conductor 12 is input into an inverting input of an AND gate 14. The output of gate 14 is input into a reset OR gate 16. The other input to gate 16 is a reset signal on lead 18. The output of gate 16, carried by lead 20, is inverted and input to a ramp generator 22. A timing controller 24 inputs a signal into generator 22 on a lead 26 for controlling the length of a timing signal produced by generator 22, as will be explained further with reference to FIG. 3. The output of generator 22 is carried by lead 28 to the inverting input of a comparator 30. The noninverting input to the comparator is a compensated reference on a lead 32. The output of comparator 30 is input on a lead 34 to an output OR gate 36. The other input of gate 36 is the output of gate 16. Gate 36 produces an output signal on lead 38 which is also fed back to a noninverting input to AND gate 14. If a system reset function is not required, OR gate 16 can be eliminated.

Figure 2:
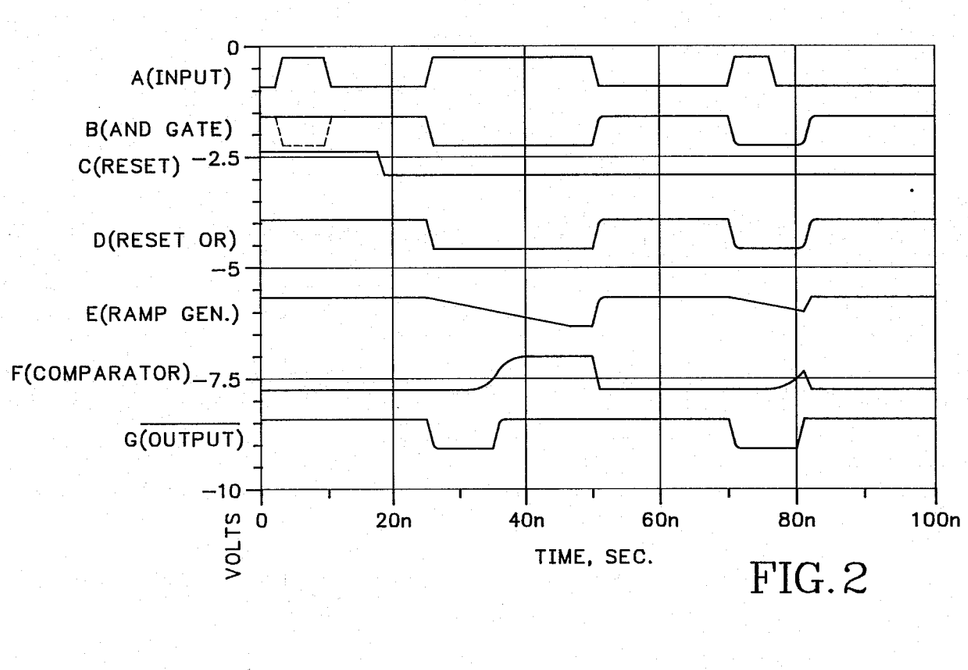
FIG. 2 is a chart showing simulated waveforms at various locations on the circuit of FIG. 1.

FIG. 2 illustrates representative simulated waveforms at various locations in the circuit of FIG. 1. Waveform A shows the input signal on conductor 12. Glitches or other events on this signal trigger the operation of circuit 10. The output of AND gate 14 is shown as waveform B. The reset signal on conductor 18 is shown as waveform C and the output of reset OR gate 16 on wire 20 is shown as waveform D. In the preferred embodiment of FIG. 3, gates 14 and 16 are lumped together so waveform B is not truly separate from waveform D. Waveform E represents the output of ramp generator 22. The comparator output existing on wire 34 is shown as waveform F and the output signal on lead 38 is shown as waveform G.

Circuit 10 is a plus clock triggered monostable. That is, if a valid rising edge is fed into the input, when the input is false, or low and it has not been agitated recently, it will generate a pulse of a specified duration. That time duration is set by an externally applied current. The pulse width of the pulse generated is proportional to the timing current that is applied. In FIG. 2 the timing current is constant.

During the first portion of the waveform shown, the circuit is in a steady state ready condition waiting for a positive edge of an input pulse to trigger an output pulse. In this state, the input on conductor 12 is low and, as will be seen, the output is high. The low input is inverted to a high input into AND gate 14 thereby resulting in two high inputs. Thus, the output of gate 14 is high resulting in a high output of OR gate 16, regardless of the condition of reset 18. If gates 14 and 16 were truly separate as shown in FIG. 1, when waveform A initially goes high, the output of the AND gate would go low, as shown by the dashed lines.

The high output from gate 16 is inverted and held low in ramp generator 22. This generator is enabled on a positive pulse, so in this state the ramp is not being generated. The output of the generator is held in a logic false or high state producing a low output from comparator 30. However, the high output of gate 16 is also fed into OR gate 36 resulting in a high output signal on lead 38. Thus, a steady state condition exists and the circuit is armed waiting for the occurrence of the signal which triggers it.

When the input waveform goes high, the output of AND gate 14 goes low. If the reset signal is also low (as shown), then gate 16 is driven by the output from gate 14.

It can be seen that so long as the reset signal is high the output of gate 16 will be high, as was the case for the initial ready state. Thus, the system does not respond to the initial input pulse represented on waveform A. However, when the reset signal goes low, the circuit is allowed to respond to the input signal. The reset thus provides for control by circuitry external to circuit 10 so that triggering can occur at a selected time. For the remainder of the discussion, it is assumed that the reset signal is maintained at a low state.

When waveform A, the input, goes high, the output of AND gate 14 goes low, thereby resulting in a low output from gate 16. This is inverted at ramp generator 22 to a high signal which initiates the ramp. The rate of ramp timing is controlled by timing control 24, which will be discussed in more detail subsequently.

The voltage ramp occurring at the output of generator 22 drops below the threshold or reference determined by the signal on lead 32, causing the output of comparator 30 to go high. A high output on comparator 30 causes gate 36 to produce a high output as well.

It will be noted that after the output pulse is generated in this case, input A is still high. A change in the input to a low state will not produce another output pulse. Further, while the output pulse is low or true, no change in the input pulse can generate a new output pulse. This is because the output signal disables AND gate 14. After the end of the long input pulse the system is again in a ready state waiting for a change in the input signal. The short pulse or glitch then shown triggers the generation of a ramp by generator 22. When the threshold of comparator 30 is reached it goes true or high momentarily. This is enough to cause the output to also go high, returning the system to a ready state, with the ramp generator returned to a high output and comparator 32 to a low output.

It will further be noted that the end of the glitch pulse on the input was shorter than the predetermined duration of the output pulse on lead 38. Thus, for a period of time the output is held low or in a logic true state even while the input has returned to low. This is because the output of reset OR gate 16 is held low with the low outputs from comparator 30 and gate 36. However, as soon as comparator 30 goes high, the output on lead 38 also goes high, resulting in the output of reset OR gate 16 also going high. This returns the circuit to its ready state.

Figure 3A:
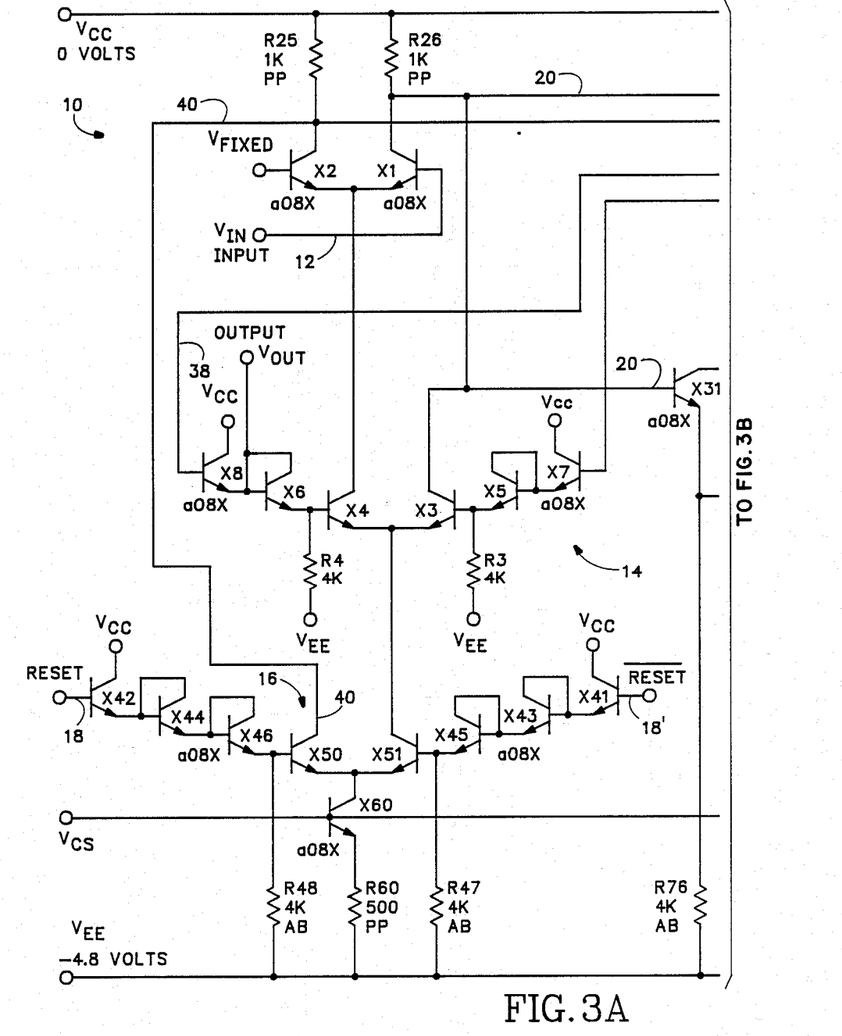
FIG. 3 is a circuit schematic of the circuit of FIG. 1.
Figure 3B:
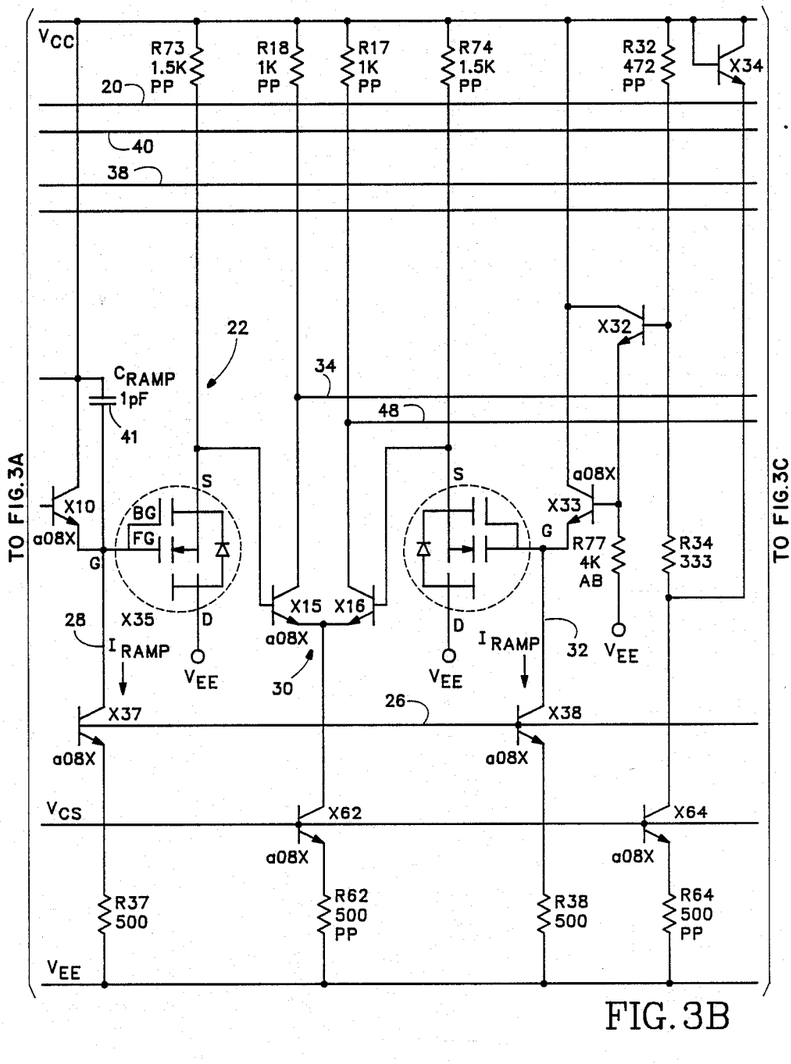
Figure 3C:
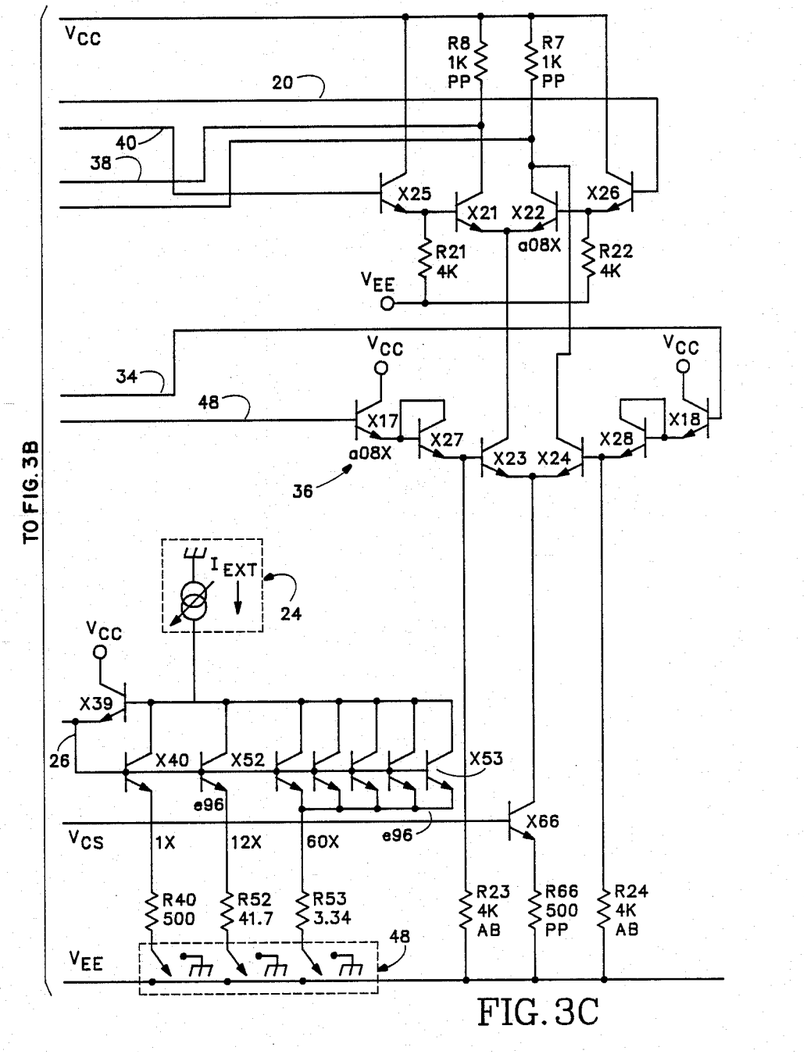

Referring now to FIGS. 3A-3C, a schematic diagram of circuit 10 is shown. As will be noted in reviewing this circuit schematic, the logic elements, that is AND gate 14 and OR gates 16 and 36, are based on emitter coupled logic (ECL) cells. Input lead 12 is connected to the base of transistor X1. The output on lead 38 is fed back to transistor X8, with the actual circuit output being taken from the emitter of transistor X8. This is an inverse output and has a logic true state when low. The inverse of the output could be taken relative to transistor X7 which is the complement of transistor X8, with the logic true state being high. The output of the AND gate is on conductor 20 which is the connection between the collectors of transistors X1 and X3. The current source which drives the AND gate is provided by transistor X60. The AND gate ma be bypassed via a conductor 40 which connects the collectors of transistors X2 and X50. This lower portion is represented by OR gate 16 in FIG. 1. The reset signal on lead 18 is a shown with a complement signal shown as conductor 18'. Transistor X51 is a complementary transistor to transistor X50. It is connected in series between AND gate 14 and its current source, transistor X60. Thus, when the reset signal is high, current is caused to be conducted in transistor X50 and not in transistor X51. This incapacitates the AND gate. Correspondingly when the reset signal is low and reset complement is high, the AND gate is functional. This use of complementary transistors also results in fast switching speeds during transitions from one state to the other.

The output of AND gate 14 on conductor 20 is connected to the base of an emitter follower transistor X31. The emitter of transistor X31 is connected to the base of emitter follower transistor X10. Transistor X10 is the switch, in essence, which controls the operation of ramp generator 22. A ramp capacitor 41 is connected across the collector and emitter of transistor X10. One side of the capacitor is thus also connected to the collector voltage source. The other side of the capacitor and the emitter of transistor X10 are also connected to a current source defined by transistor X37 which regulates the ramp current. The emitter of transistor X10 is also connected to the gate of a p-type JFET X35 which is connected as a source follower, its drain being connected to the drain (collector) voltage supply.

Comparator 30 is formed by complementary transistors X15 and X16 which are driven by a current driver transistor X62. There is a complementary circuit on the opposite side of comparator 30 which is nearly identical to the circuit associated with ramp capacitor 41, except that it does not contain a capacitor. The base of transistor X32, which corresponds to transistor X31, is connected to a biased voltage potential determined by positive temperature coefficient resistors R32 and R34, a negative temperature coefficient resistor formed from transistor X34, which is connected as a diode, and a current source defined by transistor X64. As the temperature increases in these components, more current passes through diode X34 rather than through resistors R32 and R34. This means that the voltage level at the base of transistor X32 remains largely unchanged. The values of the resistors and the diode are not necessarily chosen so that they completely offset each other. Rather, their values are chosen to stabilize overall timing performance over changes in operating temperature.

Figure 6:
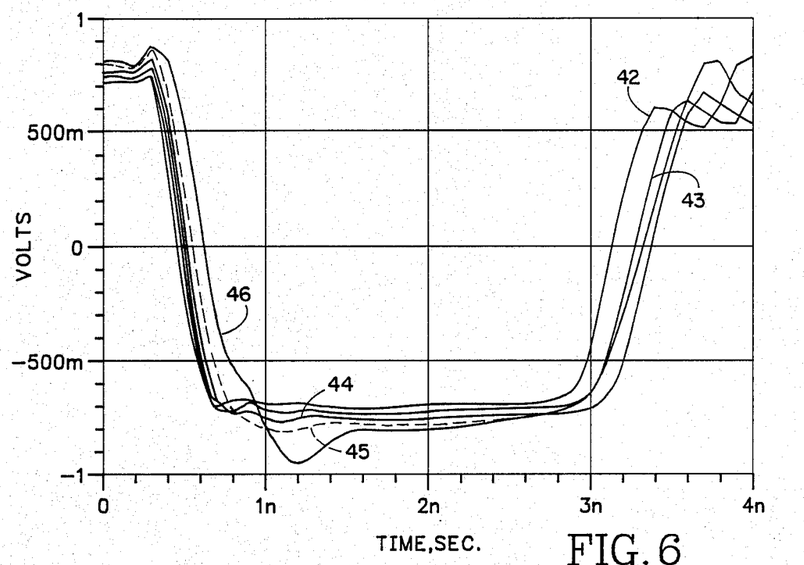
FIG. 6 shows a family of simulated output pulses for different temperatures.
Figure 7:
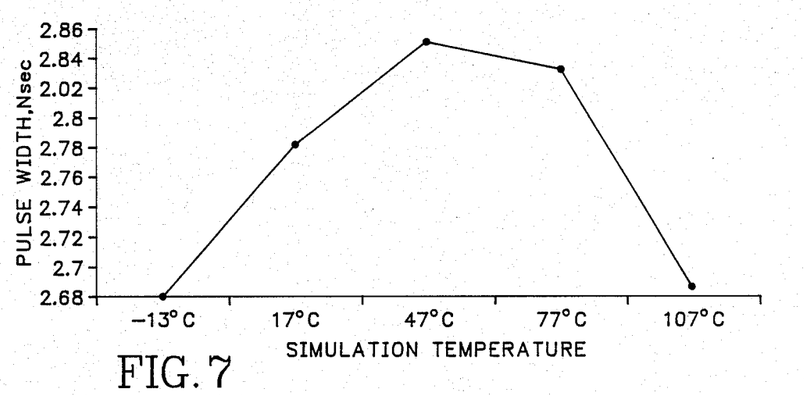
FIG. 7 is a graph of simulated pulse width as a function of circuit temperature corresponding to the pulses of FIG. 6.

The effectiveness of the temperature compensation was tested in a simulation of circuit 10. The results are shown in FIGS. 6 and 7. In FIG. 6, curves 42, 43, 44, 45 and 46 represent the output signal for operating temperatures of −13, 17, 47, 77 and 107 degrees Centigrade, respectively. In FIG. 7, the pulse widths are plotted as a function of temperature. The pulse width varies from about 2.68 nanoseconds at the lower and upper temperature extremes to about 2.85 nanoseconds at the intermediate temperature. This is equivalent to about a six percent drop from the maximum pulse width at 47 degrees Centigrade. Thus, relatively effective temperature stability is obtained with the relatively simple circuitry of the preferred embodiment. That is, only a current source and three passive devices are required to provide the compensated reference voltage. Also, the fact that the comparator uses a circuit having most elements the same as the ramp generator, results in offsetting changes in the ramp generator and comparator reference. The outputs of the comparator are taken on leads 34 and 48 from the collectors of complementary transistors X15 and X16, as shown. There is thus a differential change which occurs during transitions from one logic state to another. This provides for increased speed of operation of the comparator, as was the case with reset circuit 16.

The timing controller 24 is represented in part by an external current source shown in dashed outline in FIGS. 3A–3C. This current source is fed to the base of a transistor X39 and the collectors of a series of transistors which are all connected at their bases to the emitter of transistor X39. Transistors X37, X38, X40, X52 and X53 represent a plurality of transistors which function as a programmable current mirror. That is, the current passing through each transistor, if the transistors are identical, will be the same. If the emitter resistors vary and the area of the transistor emitter varies, then the currents will vary proportionately.

Notice that current mirrors X37 and X38 ensure that the reference tracks voltage changes between the base and emitter in transistor X10 due to variations in external current from controller 24.

This bank of transistors attenuates the current signal coming from external timing controller 24. Thus, any noise occurring in this external current source is going to be substantially attenuated as it is carried through transistor X39 to the current source transistors X37 and X38 driven at their bases by connection to transistor X39. Also, it provides for a substantially decreased sensitivity of operation for controlling the pulse width of circuit 10 since larger current changes are required in the external current source to achieve a given change in pulse width.

In this preferred embodiment, the current mirror attenuators (X52, X53) are not required. Further, the noise rejection they provide is in part redundant because of the noise cancelling provided by the reference voltage generator.

A series of switches, identified generally at 48, provide for the remote control of the current mirror transistors. Varying the number of transistors in the current mirror controls the sensitivity and controlling range of current levels experienced by the external current controller.

Thus, with the current for ramp generator 22 thus derived and controlled in transistor X37, it can be seen that so long as transistor X31 and, more particularly, transistor X10 are on, no current passes through capacitor 41. This is the case when the input on lead 20 is high, turning transistor X10 on via transistor X31. When that lead goes low, transistor X10 is turned off, resulting in the current having to pass through the ramp capacitor. The result is a reasonably linear timing ramp until the capacitor charges sufficiently to turn the emitter follower transistor X10 back on. However, the reference voltage on transistor X32 is set so that comparator 30 changes logic states when the capacitor is approximately half charged. Thus, even though the emitter follower may turn on gradually, the capacitor ramp is substantially linear over the region of interest.

If input 12 remains high, the emitter follower comes back on at a relatively low state. As it is pulled high to be reset, the emitter-follower transistor X10 pushes charge up into the capacitor so that the only effect that takes place during switching of transistor X10 is through the capacitor. Also, by connecting the capacitor directly to the collector voltage supply and separating it from the lower voltage supply, voltage surges, due to resetting the capacitor charge, do not get imposed onto either of the two voltage supplies. This is particularly desirable considering the fast transitions which occur in this circuit during reset conditions. The circuit thus provides low noise operation and does not adversely affect the voltage supplies.

The use of the JFET for driving comparator 32 also has the particular advantage that there is essentially no gate current when transistor X35 is used. If a conventional NPN or PNP transistor was used, there would be some base current available to the timing capacitor. This would interfere with the generation of the ramp voltage which is produced, particularly if the current applied by controller 24 is very small. With the circuitry shown, however, the circuit operation is fairly clean.

The outputs of the OR gate occur on conductors 20 and 40. The signal on conductor 20 is in a logic true state when low. The complementary output signal on conductor 40 is logic true when high. The output of monostable circuit 10 is taken at the emitter of transistor X8, as described previously, in order to obtain the signal levels at that transistor.

Figure 4:
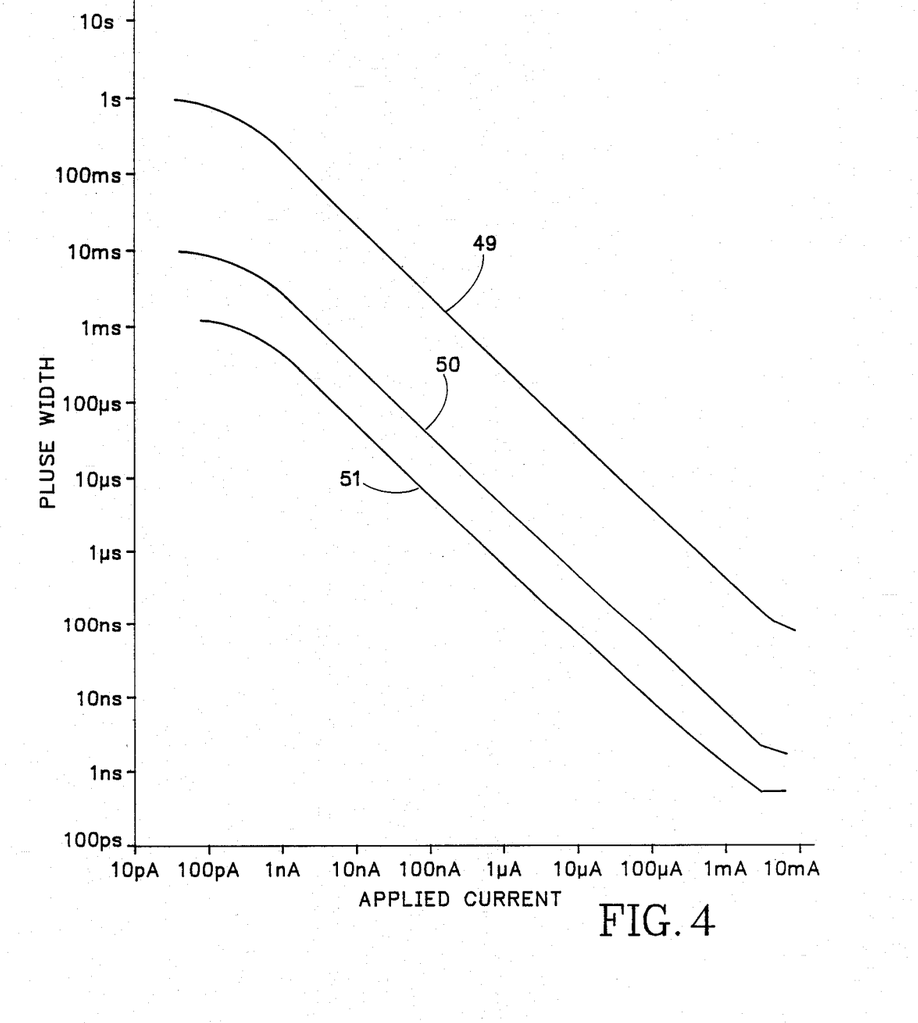
FIG. 4 is a chart showing pulse width as a function of applied current for three different timing capacitance values in a simulation of the circuit of FIG. 3.

Referring now to FIG. 4, the results of a simulation run are shown. In this simulation, three timing ramp capacitor values were used: 1,000 pF (curve 49), 10 pF (curve 50) and 1 pF (curve 51). In each of these the input current was varied from approximately 100 pA to 1 mA. Logarithmic results were obtained for approximately six orders of magnitude. The resulting range of pulse widths varied as a function of the value of the capacitor, as shown. This is as expected since monostable circuit timing is conventionally determined in part by capacitor value. The pulse widths also varied by six orders of magnitude. This circuit thus provides a very large range of output pulse width.

Figure 5:
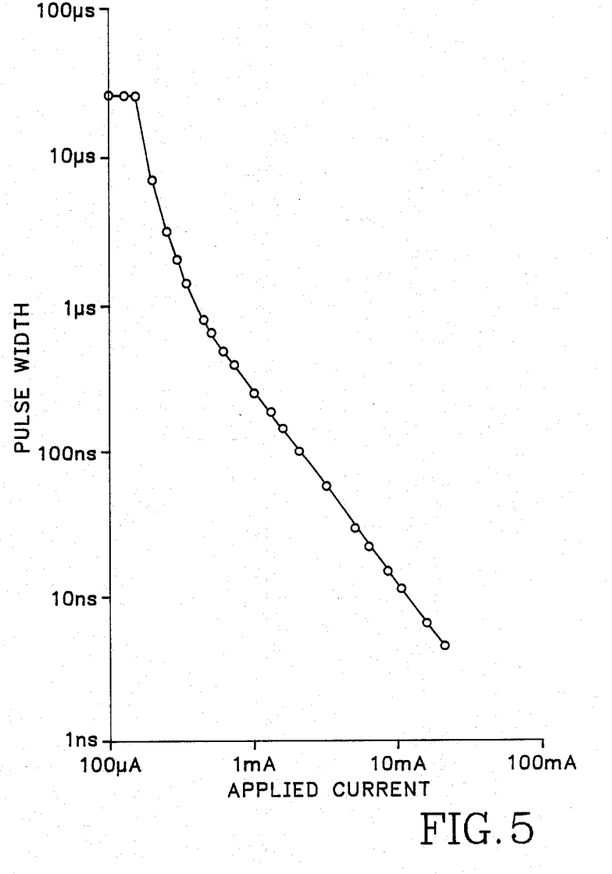
FIG. 5 is a chart showing measured pulse width as a function of applied current for an actual device.

An actual circuit was constructed according to the circuit shown in FIG. 3 and tested over a lesser range of current values. These results are shown in FIG. 5. It can be seen that the results are not as extensive as those obtained in the simulation. A range of a little over four orders of magnitude was realized. However, the actual test results were limited in testing by the test gear which was used.

The bandwidth of the test gear limited the measurements that could be made once the upper point of the tests were reached, as shown in FIG. 5. That is, as the current was increased, the pulse became so narrow that it simply appeared as a point on the display of the test gear used. Thus, the result shown in FIG. 5 may actually conform with that shown in the simulation if appropriate test gear is available.

It will therefore be appreciated that a monostable circuit is provided which is self-latching. That is, the circuit is held in a ready state with the inverse output (negative logic) high. When an input of a desired form occurs, such as a positive going pulse in the preferred embodiment, the output then goes low or true. This prevents any further changes in the input signal from affecting operation of the circuit, until the predetermined output pulse is completed. Further, a reset function is incorporated so that the entire circuit can be controlled from an external source. The ramp capacitor is connected directly across an emitter follower transistor, both of which, by definition, are thus connected directly to the collector voltage supply and separated from the lower voltage supply. Voltage surges due to transitions in resetting the ramp are accommodated within the transistor/capacitor loop, rather than imposed on the voltage supplies. Thus, relatively noise-free switching is provided.

Further, a substantially linear ramp is provided by using a JFET to transfer the ramp signal to the comparator. The reference signal on the comparator is compensated for temperature changes and is built using a circuit substantially identical to the one associated with the ramp capacitor. Variation in operation of these components thus tends to be self correcting. Also, an external current supply is variable to vary the output pulse width by several orders of magnitude. The use of a programmable current mirror circuit allows external switching of current mirrors so that the current sensitivity and current range required to change the output pulse width can be externally controlled.

Variations in form and design of the preferred embodiment may be made without varying from the spirit and scope of the invention as defined in the claims. For instance, TTL logic circuitry could be used to implement the same asynchronous state machine. Also, the external current supply operating through the programmable current mirrors could be replaced by a variable voltage supply and a resistor. This may not provide the precise current control that is provided by the preferred embodiment, but it is still functional. Other variations in circuit design may also be made. Further, different logic states could be used for the various signals in the circuit.

I claim:

1. A self-latching monostable circuit responsive conditionally to an input signal for generating an output signal having a pulse of a predetermined duration comprising:
    AND gate means having two input ports including an inverting input on one of the input ports and an output port, one of said input ports being coupled to the input signal and the other of said input ports being coupled to said output signal;
    OR gate means having two input ports for generating the output signal, one of said input ports of said OR gate means being coupled to said output of said AND gate means; and
    timing means having an input port coupled to said output port of said AND gate means, an output port coupled to the other of said input ports of said OR gate means, and a ramp capacitor coupled to the input port, the ramp capacitor being charged by a variable charging current, said timing means being responsive to the output of said AND gate means for changing the signal at said output port of said timing means from a first logic state to second logic state a predetermined period of time after the output of said AND gate means changes from a first logic state to a second logic state, said predetermined period of time being variable, whereby the output signal has a pulse of a predetermined width beginning when the input signal changes from a first to a second logic state while preventing further changes in the input signal from affecting the output signal during the predetermined duration, the output signal being latched in a predetermined logic state for the predetermined duration.

2. A circuit according to claim 1 wherein said timing means further comprises timing ramp generating means for generating a timing signal having a voltage level varying at a predetermined rate in response to a change in logic level of the signal on the input to said timing means, means for comparing said timing signal and a reference voltage of generating a comparator signal having a pulse with a duration corresponding to the time said timing signal exceeds the reference voltage, and means for generating said reference voltage compensated for changes in the operation of said comparator means due to changes in temperature.

3. A circuit according to claim 2 wherein said means for generating said reference voltage further comprises transistor means and temperature compensating resistor means coupled in parallel to said transistor means for biasing said transistor means such that said resistor means varies in value according to changes in temperature of said resistors to compensate for changes in operation of said transistor means due to changes in temperature of said transistor means.

4. A circuit according to claim 1 wherein said timing means further comprises timing ramp generating means for generating a timing signal having a voltage level varying at a predetermined rate in response to a change in logic level of the signal on the input of said timing means, means for generating a reference voltage, means for comparing said timing signal and said reference voltage to generate a comparator signal having a pulse with a duration corresponding to the time said timing signal exceeds said reference voltage, and current mirror means having an input for receiving an externally applied current and first and second current outputs, said timing ramp generating means and reference voltage generating means each having a current input coupled to one of the first and second current outputs of said current mirror means in such a manner that any changes in bias of said timing ramp generating means are offset by corresponding changes in bias of said reference voltage generating means.

5. A circuit according to claim 1 further comprising a first voltage supply and wherein said timing means further comprises timing ramp capacitor means one side of which is tied directly to said first voltage supply, and emitter-follower transistor means coupled across said capacitor means, whereby voltage spikes generated by said emitter-follower transistor means are prevented from being transmitted to said first voltage supply.

6. A circuit according to claim 5 wherein said timing means further comprises current source means coupled to said capacitor means for generating a predetermined current for charging said capacitor means.

7. A circuit according to claim 6 wherein said timing means further comprises field-effect transistor means having a source coupled to said first voltage supply, the emitter of said emitter-follower transistor means being coupled directly to the gate of said field-effect transistor means.

8. A circuit according to claim 6 wherein said current source means is variable for varying the rate of charging of said capacitor means.

* * * * *